US012787249B2

(12) United States Patent
Wang et al.

(10) Patent No.: US 12,787,249 B2
(45) Date of Patent: Nov. 3, 2026

(54) METHOD FOR FORMING CAPACITOR AND SEMICONDUCTOR DEVICE

(71) Applicant: CHANGXIN MEMORY TECHNOLOGIES, INC., Hefei City (CN)

(72) Inventors: Xiaoling Wang, Hefei (CN); Hai-Han Hung, Hefei (CN); Min-Hui Chang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 492 days.

(21) Appl. No.: 18/446,507

(22) Filed: Aug. 9, 2023

(65) Prior Publication Data

US 2023/0389266 A1 Nov. 30, 2023

Related U.S. Application Data

(63) Continuation of application No. PCT/CN2021/138294, filed on Dec. 15, 2021.

(30) Foreign Application Priority Data

Oct. 18, 2021 (CN) ......................... 202111208407.X

(51) Int. Cl.

*H10B 12/00* (2023.01)
*H10D 1/00* (2025.01)
*H10D 1/68* (2025.01)

(52) U.S. Cl.

CPC ........... *H10B 12/033* (2023.02); *H10D 1/042* (2025.01); *H10D 1/696* (2025.01); *H10D 1/716* (2025.01)

(58) Field of Classification Search

CPC .. H10B 12/033; H10B 12/0335; H10D 1/042; H10D 1/696; H10D 1/716
See application file for complete search history.

(56) References Cited

U.S. PATENT DOCUMENTS 8,088,668 B2 1/2012 Huang
2011/0076828 A1 3/2011 Huang
(Continued)

FOREIGN PATENT DOCUMENTS

CN 110690346 * 1/2020
CN 111106095 A 5/2020
(Continued)

OTHER PUBLICATIONS

International Search Report in the international application No. PCT/CN2021/138294, mailed on Jul. 20, 2022. 2 pages.

*Primary Examiner* — Thanhha S Pham
(74) *Attorney, Agent, or Firm* — Syncoda LLC; Feng Ma

(57) ABSTRACT

Method for forming a capacitor includes following operations. A base is provided. First supporting layer and first sacrificial layer are formed on the base sequentially. First through holes penetrating first supporting layer and first sacrificial layer are formed to expose the base. First through holes are filled to form first filling structures. Second supporting layer covering remaining first sacrificial layer and first filling structures is formed. Second through holes penetrating second supporting layer are formed. Second sacrificial layer covering remaining second supporting layer and second through holes, and third supporting layer are formed. Third through holes penetrating third supporting layer and second sacrificial layer are formed. First filling structures are removed to communicate each of third through holes and corresponding one of first through holes. First electrode layers, dielectric layer and second electrode layer covering
(Continued)

first through holes and third through holes are formed sequentially to form the capacitor.

7 Claims, 9 Drawing Sheets

(56) References Cited

U.S. PATENT DOCUMENTS

| | | | | |
|---|---|---|---|---|
| 2013/0005110 | A1* | 1/2013 | Yoon | H10D 1/716 438/381 |
| 2020/0395438 | A1 | 12/2020 | Kang | |

FOREIGN PATENT DOCUMENTS

| | | | |
|---|---|---|---|
| CN | 111223843 | A | 6/2020 |
| KR | 20070050164 | A | 5/2007 |
| WO | WO-2021175154 | * | 9/2021 |

* cited by examiner

METHOD FOR FORMING CAPACITOR AND SEMICONDUCTOR DEVICE

CROSS-REFERENCE TO RELATED APPLICATIONS

This application is a U.S. continuation application of International Application No. PCT/CN2021/138294, filed Dec. 15, 2021, which claims priority to Chinese Patent Application No. 202111208407.X, filed Oct. 18, 2021. International Application No. PCT/CN2021/138294 and Chinese Patent Application No. 202111208407.X are incorporated herein by reference in their entireties.

BACKGROUND

Dynamic random access memory (DRAM) is a semiconductor memory device commonly used in computers, and is composed of a plurality of repeated storage units. Each of the storage units includes a transistor and a capacitor. The gate of the transistor is connected to a word line, the drain of the transistor is connected to a bit line, and the source of the transistor is connected to the capacitor.

With the continuous reduction of the manufacturing process dimension of DRAM devices, the height of a capacitor in DRAM is developing towards high aspect ratio, and meanwhile it is also necessary to ensure that there is an enough capacitor storage capacity per unit area of the capacitor, which makes it more difficult to etch a capacitor hole in the capacitor. Therefore, how to provide a method for forming a capacitor which can ensure the perpendicularity of the capacitor hole is an urgent problem to be solved.

SUMMARY

The disclosure relates to the technical field of semiconductors, and relates to, but is not limited to, a method for forming a capacitor and a semiconductor device.

In a first aspect, embodiments of the disclosure provide a method for forming a capacitor. The method includes the following operations.

A base is provided.

A first supporting layer and a first sacrificial layer are formed on the base sequentially.

First through holes penetrating the first supporting layer and the first sacrificial layer are formed to expose the base.

The first through holes are filled to form first filling structures.

A second supporting layer covering the remaining first sacrificial layer and the first filling structures is formed.

Second through holes penetrating the second supporting layer are formed to expose the first filling structures. A cross-sectional area of each of the first through holes is smaller than a cross-sectional area of each of the second through holes in a plane parallel to a radial direction of the first through holes.

A second sacrificial layer covering the remaining second supporting layer and the second through holes is formed.

A third supporting layer covering the second sacrificial layer is formed.

Third through holes penetrating the third supporting layer and the second sacrificial layer are formed to expose the first filling structures.

The first filling structures are removed to communicate each of the third through holes and a corresponding one of the first through holes.

First electrode layers, a dielectric layer and a second electrode layer covering the first through holes and the third through holes are formed sequentially to form a capacitor.

In a second aspect, embodiments of the disclosure provide a semiconductor device which at least includes a base and a capacitor. The capacitor includes a first supporting layer, a second supporting layer and a third supporting layer disposed sequentially parallel to the base; first electrode layers disposed perpendicular to the base and penetrating the first supporting layer, the second supporting layer and the third supporting layer, in which the filling sub-layers are disposed between the second supporting layer and the first electrode layers; a dielectric layer covering the surfaces of the first electrode layers, the first supporting layer, the second supporting layer and the third supporting layer; and a second electrode layer covering a surface of the dielectric layer.

BRIEF DESCRIPTION OF THE DRAWINGS

In the accompany drawings (which are not necessarily drawn to scale), similar reference numerals may describe like components in different views. Similar reference numerals with different letter suffixes may denote different examples of similar components. The accompanying drawings generally illustrate the various embodiments discussed herein by way of example, rather than limitation.

DESCRIPTION OF REFERENCE NUMERALS

Figure 1:
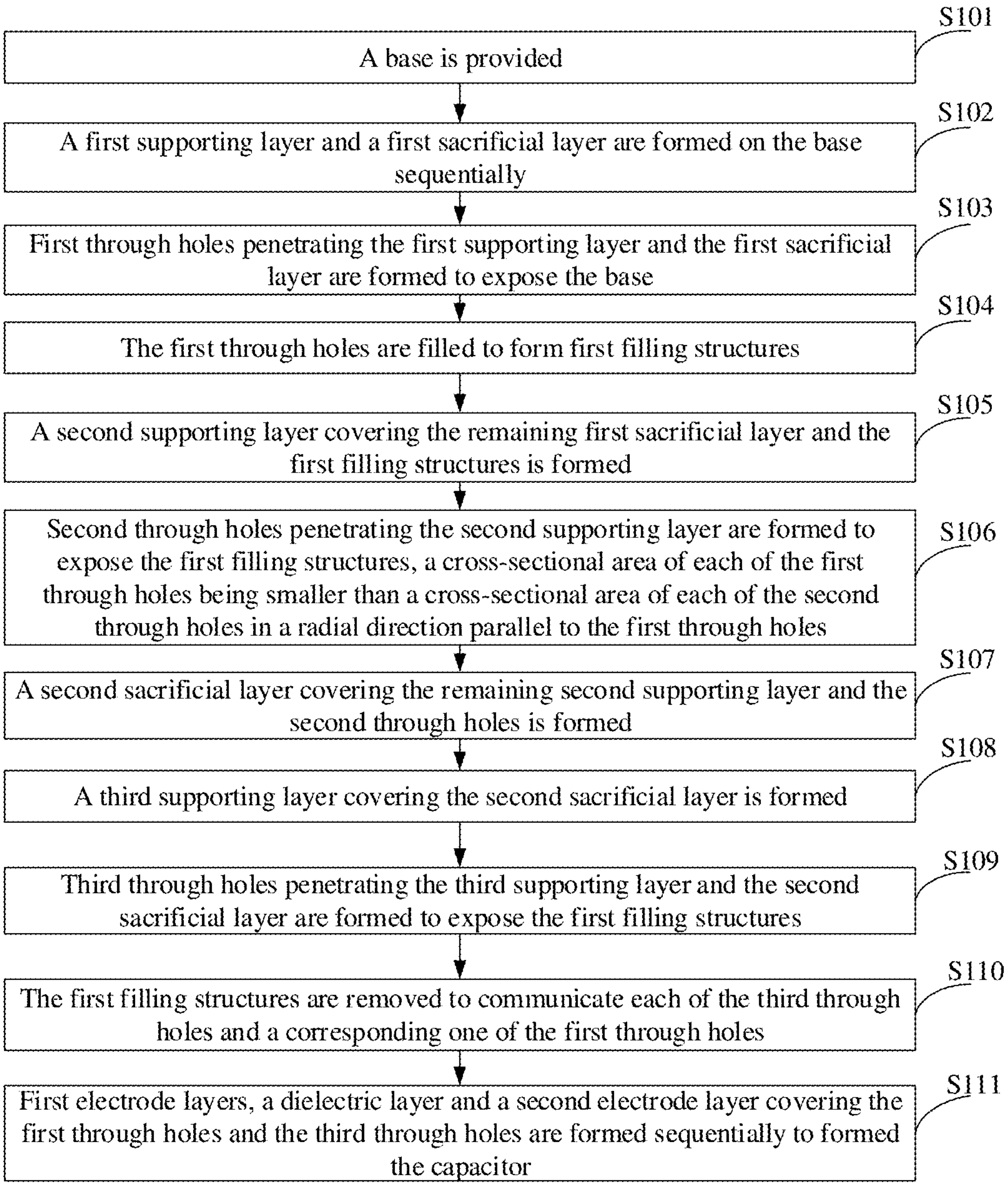
FIG. 1 is a flowchart of a method for forming a capacitor provided by an embodiment of the disclosure.

201/701—Base; 202/702—First supporting layer; 203—First sacrificial layer; 204—First through hole; 205—First filling structure; 206/703—Second supporting layer; 207—Second through hole; 208—Second sacrificial layer; 2081/706—filling sub-layer; 2082—sacrificial sub-layer; 209/704—Third supporting layer; 210—Third through hole; 211/501/705—First electrode layer; 212/504/707—Dielectric layer; 213/505/708—Second electrode layer; 502—First opening; 503—Second opening; 601—Fourth through hole; 602—Second filling structure; 603—Third through hole; 70—Semiconductor device; 801—Conductive structure.

DETAILED DESCRIPTION

With reference to accompany drawings of embodiments of the disclosure, a specific technical solution of the disclosure will be further described in detail below. The following embodiments are used to illustrate the disclosure, but are not used to limit the scope of the present disclosure.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure. That is, not all features of the actual embodiments are described herein, and well-known functions and structures are not described in detail.

In the accompany drawings, the dimensions of layers, regions, elements and their relative dimensions may be exaggerated for clarity. The same reference numerals denote the same elements throughout.

It should be understood that when an element or layer is referred to as being "above", "adjacent to", "connected to" or "coupled to" another element or layer, it may be directly above, adjacent to, connected to, or coupled to the other element or layer, or intervening elements or layers may exist. Conversely, when an element is referred to as being "directly above", "directly adjacent to", "directly connected to" or "directly coupled to" another element or layer, there is no intervening element or layer. It should be understood that, although the terms "first, second, third, etc." may be used to describe various elements, components, regions, layers, and/or portions, the elements, components, regions, layers, and/or portions should not be limited by such terms. These terms are used only to distinguish one element, component, region, layer, or portion from another element, component, region, layer, or portion. Thus, a first element, component, region, layer, or portion discussed below may be represented as a second element, component, region, layer, or portion without departing from the teachings of the disclosure. The discussion of a second element, component, region, layer or portion does not imply that a first element, component, region, layer or portion is necessarily present in the disclosure.

Spatially relational terms such as "below", "under", "lower", "beneath", "above", and "upper" etc. may be used herein for conveniently describing a relationship between one element or feature and another element or feature illustrated in the figures. It is to be understood that, in addition to the orientations shown in the figures, the spatially relational terms are intended to further include different orientations of a device in use and operation. For example, if the device in the figures is turned over, elements or features described as being "under" or "beneath" or "below" other elements or features will be oriented to be "on" the other elements or features. Therefore, the exemplary terms "under" and "below" may include both upper and lower orientations. The device may be additionally oriented (rotated by 90 degrees or otherwise), and the spatial descriptors used herein are interpreted accordingly.

The terminology used herein is intended to describe specific embodiments only and is not to be a limitation of the disclosure. As used herein, the singular forms "a", "an" and "said/the" are also intended to include the plural forms, unless the context clearly indicates otherwise. It should also be understood that the terms "compose" and/or "include", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

In the related art, when a capacitor hole of a capacitor is formed by etching, the capacitor hole is usually formed after one etching. However, when a capacitor hole with a high aspect ratio is formed, the etching method of a capacitor hole is easy to cause an etching deflection when etching to form the lower part of the capacitor hole. That is to say, there will be a non-perpendicular etching at the lower part of the capacitor hole with a high aspect ratio formed by one etching, which will reduce the electrical properties of the capacitor and the stability of the capacitor structures.

Based on the problems existing in the related art, embodiments of the disclosure provide a method for forming a capacitor. Reference is made to FIG. 1. FIG. 1 is a flowchart of a method for forming a capacitor provided by an embodiment of the disclosure. The capacitor provided by the embodiments of the disclosure may be formed by the following operations.

In S101, a base is provided.

In S102, a first supporting layer and a first sacrificial layer are formed on the base sequentially.

In S103, first through holes penetrating the first supporting layer and the first sacrificial layer are formed to expose the base.

In S104, the first through holes are filled to form first filling structures.

In S105, a second supporting layer covering the remaining first sacrificial layer and the first filling structures is formed.

In S106, second through holes penetrating the second supporting layer are formed to expose the first filling structures. A cross-sectional area of each of the first through holes is smaller than a cross-sectional area of each of the second through holes in a plane parallel to a radial direction of the first through holes.

In S107, a second sacrificial layer covering the remaining second supporting layer and the second through holes is formed.

In S108, a third supporting layer covering the second sacrificial layer is formed.

In S109, third through holes penetrating the third supporting layer and the second sacrificial layer are formed to expose the first filling structures.

In S110, the first filling structures are removed to communicate each of the third through holes and a corresponding one of the first through holes.

In S111, first electrode layers, a dielectric layer and a second electrode layer covering the first through holes and the third through holes are formed sequentially to form the capacitor.

Referring to FIGS. 2A to 2J, the method for forming a capacitor provided by the embodiments of the present disclosure will be described in detail below.

Figure 2A:
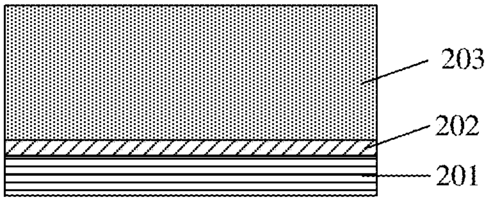
FIGS. 2A to 2J are schematic diagrams of partial structures corresponding to a method for forming a capacitor provided by an embodiment of the disclosure.

As shown in FIG. 2A, S101 and S102 are performed. A base 201 is provided, and a first supporting layer 202 and a first sacrificial layer 203 are formed on the base 201 sequentially.

In some embodiments, the base 201 may be made from a semiconductor material, such as one or more of silicon, germanium, silicon-germanium compounds and silicon-carbon compounds.

In an embodiment of the disclosure, a first supporting layer 202 and a first sacrificial layer 203 may be formed on the base 201 sequentially by means of a physical vapor deposition (PVD), a chemical vapor deposition (CVD) or an atomic layer deposition process.

Here, in order to facilitate the etching of the first sacrificial layer 203, a material for forming the first sacrificial layer 203 may be a soft material such as phosphoro-silicate glass (PSG), boro-phospho-silicate glass (BPSG) or fluoro-silicate glass (FSG). A material for forming the first supporting layer 202 may be a nitride, such as silicon nitride, silicon carbonitride, silicon oxynitride, or silicon boronitride, etc.

Figure 2B:
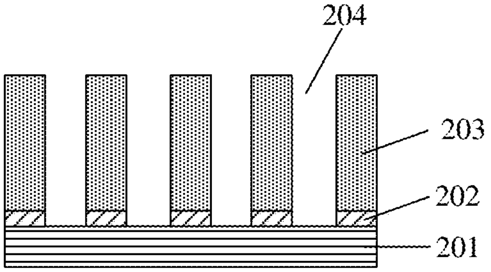

Referring to FIG. 2B, S103 is performed. First through holes 204 penetrating the first supporting layer 202 and the first sacrificial layer 203 are formed to expose the base 201.

In some embodiments, a patterned mask layer (not shown) covering the first sacrificial layer 203 may be deposited before forming the first through holes 204. A material of the hard mask may be polysilicon.

In some embodiments, based on the patterned mask layer, the first through holes 204 are formed by a dry etching process or a wet etching process. The mask layer is removed after forming the first through holes 204. In the dry etching, the first supporting layer 202 and the first sacrificial layer 203 may be etched with a fluorine-containing gas as an etchant. For example, a gas such as nitrogen trifluoride ($NF_3$) and carbon tetrafluoride ($CF_4$) may be used as the etchant to form the first through holes 204. In the wet etching, a solution such as hydrofluoric acid or phosphoric acid may be used as an etchant to form the first through holes 204.

In some embodiments, a thickness range of the first supporting layer 202 may be between 50 nm and 150 nm. A thickness range of the first sacrificial layer 203 may be between 150 nm and 300 nm.

Figure 2C:
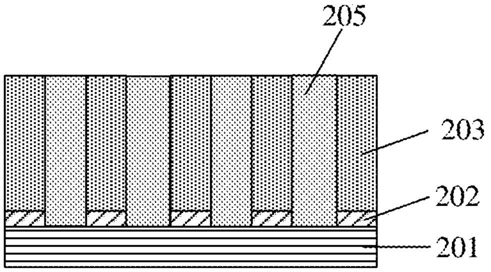

Referring to FIG. 2C, S104 is performed. The first through holes 204 are filled to form first filling structures 205. Here, the first filling structures 205 may be formed by physical vapor deposition, chemical vapor deposition, atomic layer deposition or spin coating. A material of the first filling structures 205 may be an easily removed material such as a carbon-containing material, spin-on glass, spin-on carbon or a photoresist, so as to facilitate removal of the first filling structures 205 when the capacitor holes are subsequently formed. Top surfaces of the first filling structures 205 may be flush with a top surface of the remaining first sacrificial layer 203 to form a flat surface, thereby providing a flat support surface for subsequent formation of the second supporting layer 206.

Figure 2D:
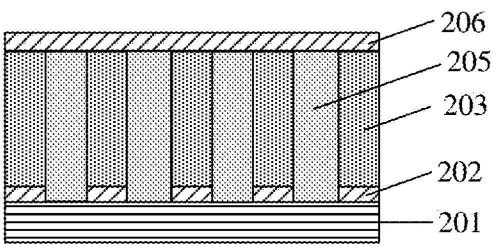

Referring to FIG. 2D, S105 is performed. A second supporting layer 206 covering the remaining first sacrificial layer 203 and the first filling structures 205 is formed.

Here, the second supporting layer 206 may be formed by physical vapor deposition, chemical vapor deposition or atomic layer deposition. A material of the second supporting layer 206 may be the same as or different from the material of the first supporting layer 202. The material for forming the second supporting layer 206 may be a nitride, such as silicon nitride, silicon carbonitride, silicon oxynitride, or silicon boronitride, etc.

Figure 2E:
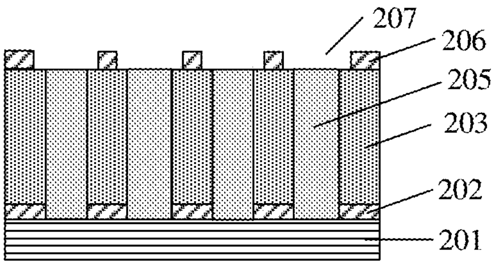

Referring to FIG. 2E, S106 is performed. Second through holes 207 penetrating the second supporting layer 206 are formed to expose the first filling structures 205. A cross-sectional area of each of the first through holes 204 is smaller than a cross-sectional area of each of the second through holes 207 in a plane parallel to a radial direction of the first through holes 204.

In an embodiment of the disclosure, the second through holes, each with a cross-sectional area larger than that of each of the first through holes, are formed in the second supporting layer, so that in the process of forming the capacitor holes by etching in steps, even if there is a deviation between the positions of the capacitor holes above and below a second through hole, a connection between the capacitor holes formed by etching in steps can be realized through the second through hole with a larger cross-sectional area. Therefore, each layer of through holes of the capacitor (such as the first through holes and the third through holes) are perpendicular through holes, and thus a problem that the capacitor holes collapse due to deflection of the capacitor holes is avoided. In this way, the perpendicularity of the capacitor holes is ensured, improving the performance of the capacitor.

Figure 2F:
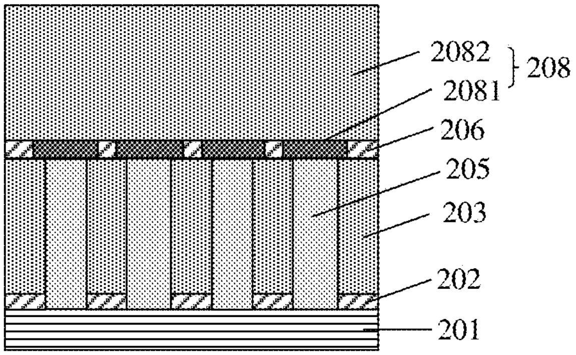
Figure 2G:
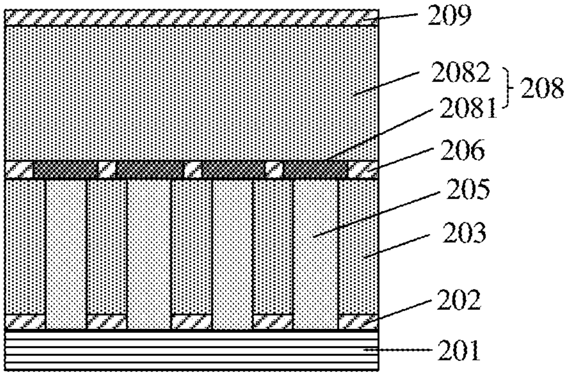
Figure 2H:
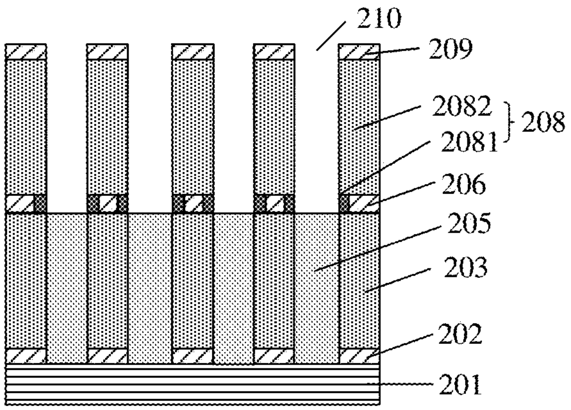
Figure 2I:
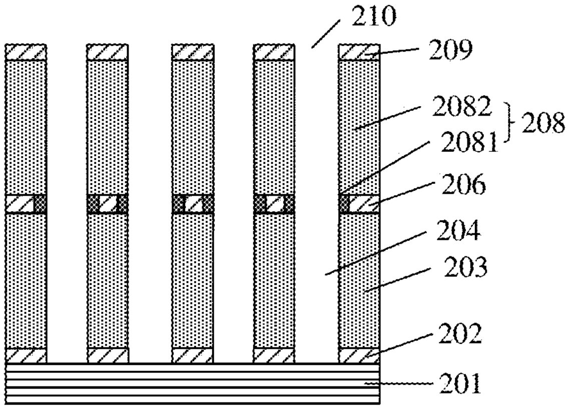

Referring to FIG. 2F, S107 is performed. A second sacrificial layer 208 covering the remaining second supporting layer 206 and the second through holes 207 is formed.

In some embodiments, a thickness range of the second supporting layer 206 may be the same as or different from a thickness range of the first supporting layer 202, and a thickness range of the second sacrificial layer 208 may be the same as or different from a thickness range of the first sacrificial layer 203. The embodiments of the disclosure do not limit them.

In some embodiments, the second sacrificial layer 208 may include filling sub-layers 2081 and a sacrificial sub-layer 2082. The filling sub-layers 2081 are used to fill the second through holes 207.

In some embodiments, after forming the second through holes 207, the filling sub-layers 2081 covering the second through holes 207 may be formed by physical vapor deposition, chemical vapor deposition or atomic layer deposition. Surfaces of the filling sub-layers 2081 relatively away from the base 201 are flush with a surface of the second supporting layer 206 relatively away from the base 201. After forming the filling sub-layers 2081, the sacrificial sub-layer 2082 covering the remaining second supporting layer 206 and the filling sub-layers 2081 is formed.

Here, a material of the filling sub-layers 2081 may be the same as or different from that of the sacrificial sub-layer 2082.

In some embodiments, when the material of the filling sub-layers 2081 is different from that of the sacrificial sub-layer 2082, a material hardness of the filling sub-layers 2081 is greater than that of the sacrificial sub-layer 2082. For example, the material of the sacrificial sub-layer 2082 may be a soft material such as phosphor-silicate glass, boron-phospho-silicate glass or fluoro-silicate glass, while the material of the filling sub-layers 2081 may be a harder material than the sacrificial sub-layer 2082, such as silicon oxide, silicon nitride, silicon carbonitride or silicon oxynitride.

In an embodiment of the disclosure, because the cross-sectional area of each of the second through holes 207 is larger than the cross-sectional area of each of the first through holes 204, a cross-sectional area of each of the filling sub-layers 2081 filling the second through holes 207 is also larger than a cross-sectional area of each of the first filling structures 205 filling the first through holes 204. Moreover, in an embodiment of the disclosure, a harder material is used for the filling sub-layers 2081, so that the unetched filling sub-layers 2081 can fill gaps formed between the first electrode layers and the supporting layer to support the first electrode layers subsequently after forming the third through holes and forming the first electrode layers on the surfaces of the third through holes.

Referring to FIGS. 2G to 21, S108 to S110 are performed. A third supporting layer 209 covering the second sacrificial layer 208 is formed. Third through holes 210 penetrating the third supporting layer 209 and the second sacrificial layer 208 are formed to expose the first filling structures 205. The first filling structures 205 are removed to communicate each of the third through holes 210 and a corresponding one of the first through holes 204.

In some embodiments, a thickness of the third supporting layer 209 may be much larger than that of the first supporting layer 202 or the second supporting layer 206, so that tops of the first electrode layers in the capacitor can be more strongly supported. Therefore, the first electrode layers are not easy to collapse when the first electrode layers are made subsequently, improving the yield and performance of the capacitor.

In some embodiments, when forming the third through holes 210, a portion of the third supporting layer 209, a portion of the sacrificial sub-layer 2082 and a portion of a filling sub-layer 2081 may be removed by an etchant corresponding to dry etching or wet etching until the first filling structures 205 are exposed to form the third through holes 210. The third through holes 210 communicate with the first through holes 204 to form the capacitor holes of the capacitor.

In some embodiments, in a dry etching, part of the third supporting layer 209, the part of the sacrificial sub-layer 2082 and the part of each of the filling sub-layers 2081 may be removed with a fluorine-containing gas as an etchant. For example, a gas such as nitrogen trifluoride ($NF_3$) and carbon tetrafluoride ($CF_4$) may be used as the etchant to form the third through holes 210. In a wet etching, a solution such as hydrofluoric acid or phosphoric acid may be used as an etchant to form the third through holes 210.

In some embodiments, a cross-sectional area of each of the third through holes 210 is smaller than the cross-sectional area of each of the second through holes 207 in a plane parallel to a radial direction of the third through holes 210, and an etching rate of the etchant to the filling sub-layers 2081 is greater than an etching rate of the etchant to the second supporting layer 206, so that the etchant does not etch the second supporting layer 206 when etching the filling sub-layers 2081 and not result in damage to the support for the capacitor.

Figure 2J:
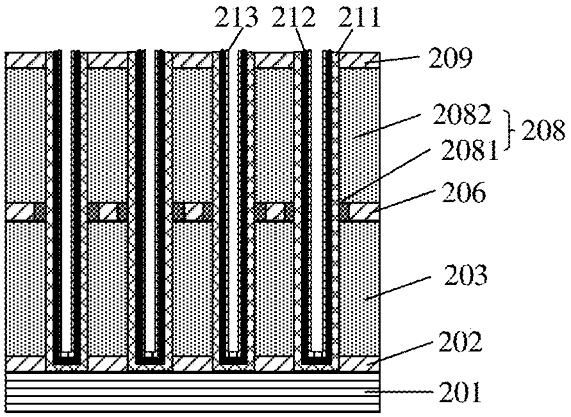

Referring to FIG. 2J, S111 is performed. First electrode layers, a dielectric layer and a second electrode layer covering the first through holes and the third through holes are formed sequentially to form a capacitor.

In the method for forming a capacitor and the semiconductor device provided by the embodiments of the disclosure, the first through holes are formed and filled after the first supporting layer and the first sacrificial layer are formed, followed by forming the second supporting layer. The second through holes, each with a cross-sectional area larger than that of each of the first through holes, are formed in the second support layer by etching. The second sacrificial layer and the third supporting layer are formed sequentially. The third through holes are formed, and the first filling structures are removed. The first electrode layers, the dielectric layer and the second electrode layer are formed sequentially on the surfaces of the first through holes and the third through holes to from the capacitor. In this way, compared with the formation of a whole through hole in the capacitor by one etching, in the embodiments of the disclosure, the through holes in the capacitor are formed by etching in steps, so that the height of the through hole to be etched each time and the etching difficulty are reduced, thereby reducing the probability of etching deflection at a bottom of the capacitor hole in the etching process of the capacitor hole of the capacitor, and thus improving the perpendicularity and quality of the capacitor hole, which is beneficial to enhancing the stability of the capacitor.

Figure 3:
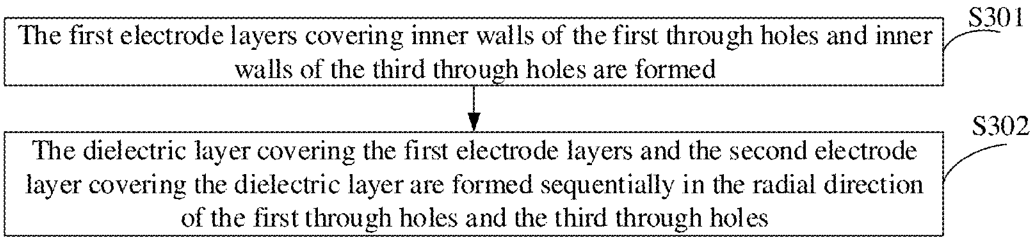
FIG. 3 is a flowchart of a method for forming a capacitor provided by an embodiment of the disclosure.

In some embodiments, FIG. 3 is a flowchart of a method for forming a capacitor provided by an embodiment of the disclosure. As shown in FIG. 3, S111 may also be performed by the following operations.

In S301, first electrode layers covering inner walls of the first through holes and inner walls of the third through holes are formed.

In S302, a dielectric layer covering the first electrode layers and a second electrode layer covering the dielectric layer are formed sequentially in the radial direction of the first through holes and the third through holes.

Figure 4:
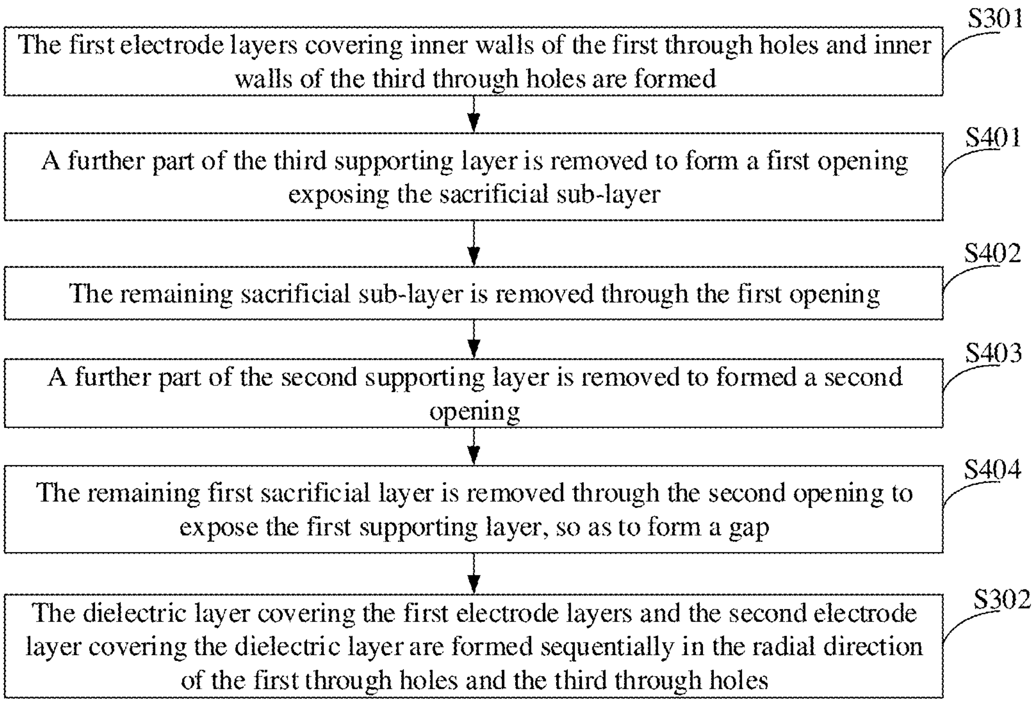
FIG. 4 is a flowchart of a method for forming a capacitor provided by an embodiment of the disclosure.

In some embodiments, as shown in FIG. 4, the embodiments of the disclosure may also include the following operations after S301.

In S401, a part of the third supporting layer is removed to form a first opening. The first opening exposes the sacrificial sub-layer.

In S402, the remaining sacrificial sub-layer is removed through the first opening.

In S403, a further part of the second supporting layer is removed to form a second opening.

In S404, the remaining first sacrificial layer is removed through the second opening to expose the first supporting layer so as to form a gap.

Based on the above embodiments, a method for forming a capacitor shown in FIG. 4 will be described in detail below with reference to FIGS. 5A to 5E.

Figure 5A:
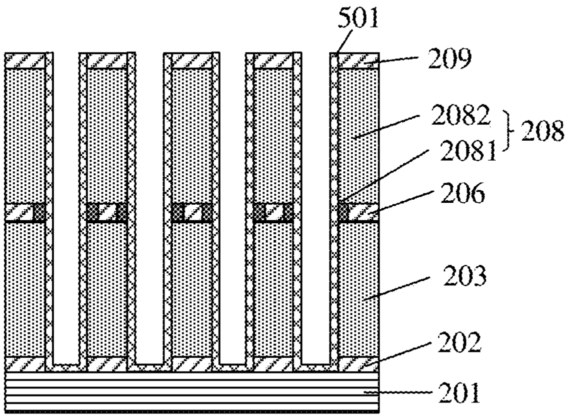
FIGS. 5A to 5E are schematic diagrams of partial structures corresponding to a method for forming a capacitor provided by an embodiment of the disclosure.

Referring to FIG. 5A, S301 is performed. The first electrode layers 501 covering inner walls of the first through holes 204 and inner walls of the third through holes 210 are formed.

In an embodiment of the disclosure, the first electrode layers 501 may be formed by physical vapor deposition, chemical vapor deposition or atomic layer deposition. A thickness of the first electrode layer may be between 10 nm and 80 nm. A material of the first electrode layers 501 may be metal nitride or metal silicide, for example, titanium nitride or titanium silicide. Here, tops of the first electrode layers 501 are flush with a top of the third supporting layer 209, so that a surface area of each of the first electrode layers 501 can be increased, thereby improving the overall capacity of the capacitor and thus the performance of the capacitor.

Figure 5B:
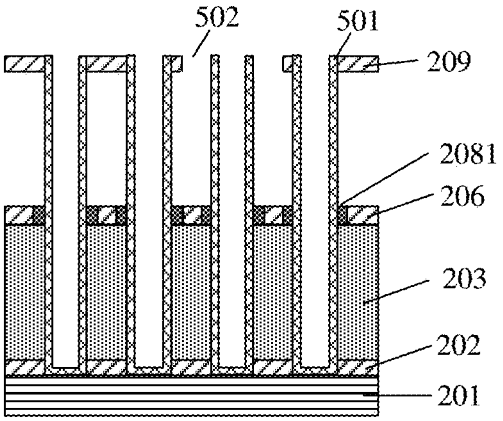

Referring to FIG. 5B, S401 and S402 are performed. A further part of the third supporting layer 209 is removed to form a first opening 502. The first opening 502 exposes the sacrificial sub-layer 2082. The remaining sacrificial sub-layer 2082 is removed through the first opening 502.

In some embodiments, a mask layer (not shown in the figure) covering the third supporting layer 209 may be formed first before the first opening 502 is formed. A material of the hard mask may be polysilicon. The mask layer may have a pattern. The first opening 502 is formed according to the pattern of the mask layer. After the first opening 502 is formed, the mask layer is removed.

In an embodiment of the disclosure, in a direction perpendicular to the base 201, one first opening 502 may be formed among every three adjacent first electrode layers 501, or one first opening 502 may be formed among every four adjacent first electrode layers 501, or only one first opening 502 may be formed in the third supporting layer 209. The embodiments of the disclosure do not limit the position and the number of the first opening 502. FIG. 5B only shows a cross-sectional view of a mode of the opening exemplarily.

In some embodiments, the sacrificial sub-layer 2082 may be removed by wet etching, in which the etchant may be a solution such as hydrofluoric acid or phosphoric acid. In this way, even if the third supporting layer 209 has only one first opening 502, the entire remaining sacrificial sub-layer 2082 can be removed through the first opening 502 using an etchant such as hydrofluoric acid.

Figure 5C:
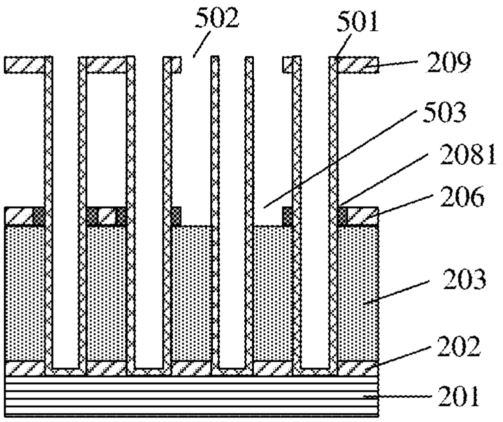

Referring to FIG. 5C, S403 is performed. A further part of the second supporting layer 206 is removed to form a second opening 503. Here, the projection position of the second opening 503 and the projection position of the first opening 502 may be the same or different in the direction perpendicular to the base 201. In an embodiment of the disclosure, the method for forming a capacitor provided by an embodiment of the disclosure is described in detail by an example where the projection position of the second opening 503 is the same as the projection position of the first opening 502.

Figure 5D:
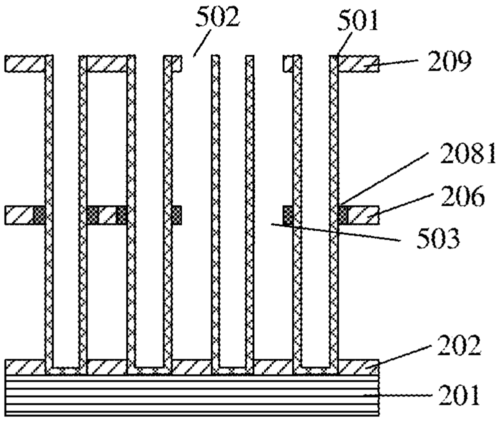

Referring to FIG. 5D, S404 is performed. The remaining first sacrificial layer 203 is removed through the second opening 503 to expose the first supporting layer 202 so as to form a gap. Here, the gap is composed of the first opening 502, a position of the original sacrificial sub-layer 2082, the second opening 503 and a position of the original remaining first sacrificial layer 203, which are communicated sequentially. The remaining first sacrificial layer 203 is removed in the same way as the sacrificial sub-layer 2082, and the remaining first sacrificial layer 203 may be removed by wet etching.

After the gap is formed, S302 is performed. A dielectric layer 504 covering the first electrode layers 501 and a second electrode layer 505 covering the dielectric layer 504 are formed sequentially in the radial direction of the first through holes and the third through holes.

Figure 5E:
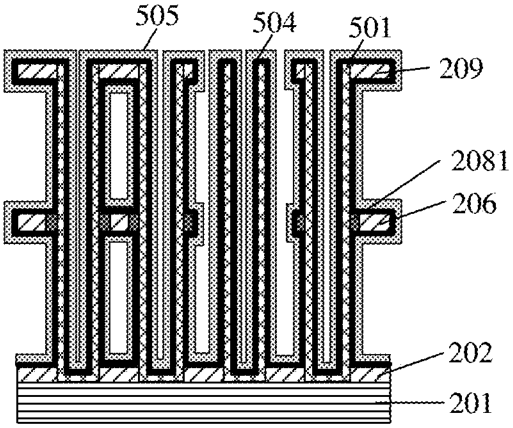

In some embodiments, as shown in FIG. 5E, the dielectric layer 504 covering the first electrode layers 501, the remaining first supporting layer 202, the further remaining second supporting layer 206, and the further remaining third supporting layer 209 may be formed in the gap, and then the second electrode layer 505 covering the dielectric layer 504 is formed.

In some embodiments, the dielectric layer 504 and the second electrode layer 505 may be formed by physical vapor deposition, chemical vapor deposition, or atomic layer deposition.

In some embodiments, a material of the dielectric layer 504 may include at least one of zirconium oxide, hafnium oxide, zirconium titanium oxide, ruthenium oxide, antimony oxide, or aluminum oxide. A material of the second electrode layer 505 may include at least one of metal nitride or metal silicide, for example, titanium nitride or titanium silicide.

Figure 6A:
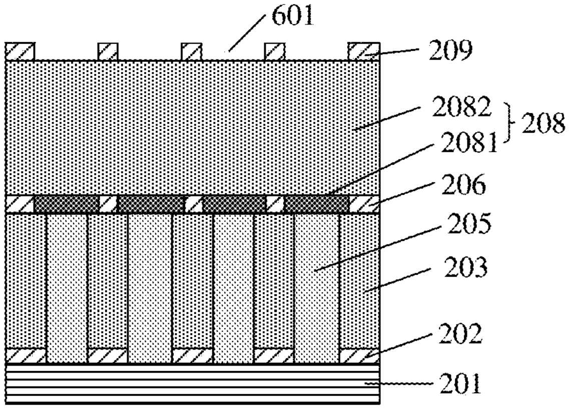
FIGS. 6A to 6D are schematic diagrams of partial structures corresponding to a method for forming a capacitor provided by an embodiment of the disclosure.
Figure 6B:
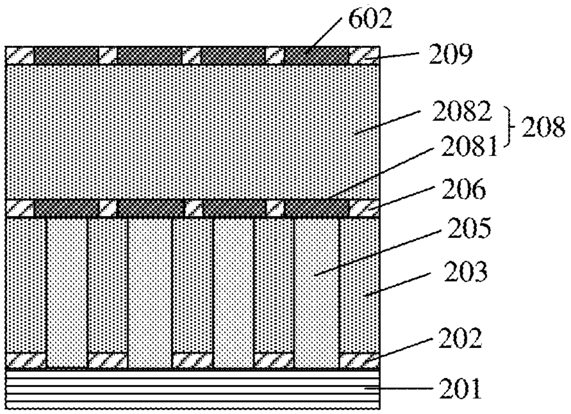
Figure 6C:
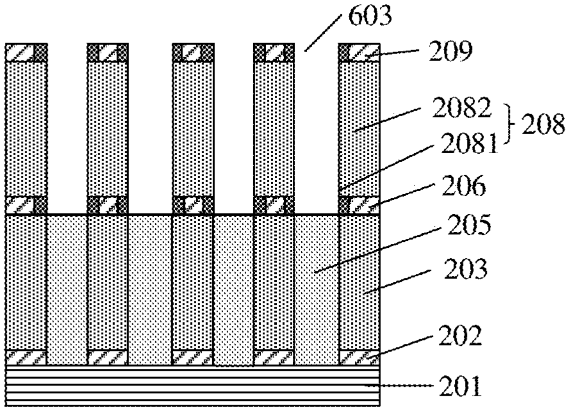
Figure 6D:
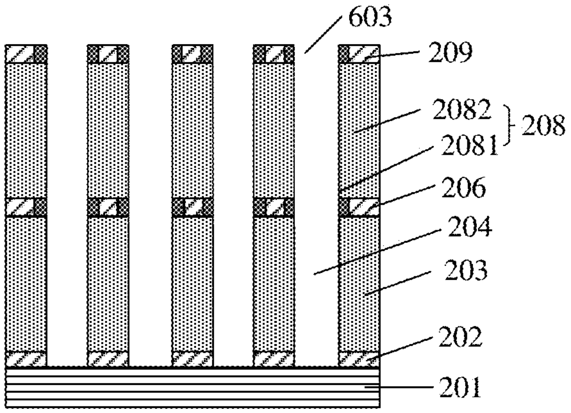

Based on the above embodiments, in some embodiments, after forming the third supporting layer 209, fourth through holes 601 penetrating the third supporting layer 209 may also be formed as shown in FIGS. 6A to 6C. The fourth through holes 601 are filled to form second filling structures 602. A part of a second filling structure 602 and a part of the second sacrificial layer 208 are finally removed to form the third through holes 603. A cross-sectional area of each of the third through holes 603 is smaller than a cross-sectional area of each of the fourth through holes 601 in a plane parallel to a radial direction of the third through holes 603.

In some embodiments, a material of the second filling structures 602 may be the same as or different from that of the filling sub-layers 2081.

In an embodiment of the disclosure, by forming the through holes, each with a larger cross-sectional area than the capacitor holes (such as the first through holes and the third through holes) in the third support layer, the method for forming a capacitor provided by an embodiment of the disclosure can be applied to an etching alignment of more than two layers of through holes of the capacitor.

In some embodiments, after forming the third through holes 603, the first filling structures 205 are removed by dry etching or wet etching to expose the first through holes 204, so that the third through holes 603 are communicated with the first through holes 204. After that, in an embodiment of the disclosure, surfaces of the third through holes 603 and surfaces of the first through holes 204 may also be cleaned by a cleaning agent, for example, by diluted hydrofluoric acid. A drying gas may then be introduced into the cleaned surfaces of the third through holes 603 and the cleaned surfaces of the first through holes 204 to dry the surfaces of the third through holes 603 and the surfaces of the first through holes 204. Here, the drying gas may be hydrogen or nitrogen.

In an embodiment of the disclosure, after the capacitor holes of the capacitor are formed, residues on the surfaces of the capacitor holes are cleaned, so that the capacitor will not fail because of the residues, improving the service life and performance of the capacitor.

Figure 7:
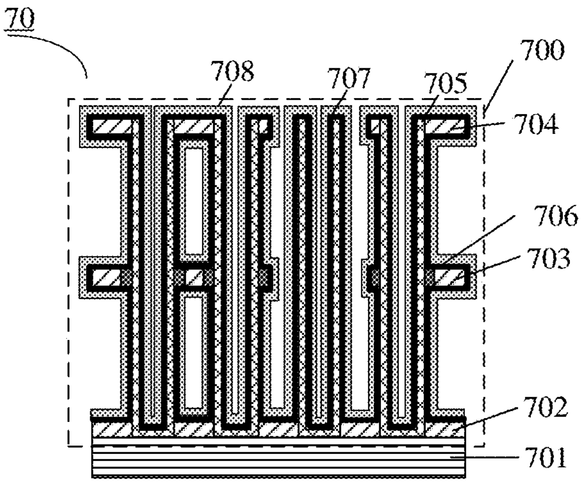
FIG. 7 is a schematic diagram of a partial structure of a semiconductor device provided by an embodiment of the disclosure.

Based on the above method for forming a capacitor, embodiments of the disclosure provide a semiconductor device 70. As shown in FIG. 7, the semiconductor device 70 includes at least a capacitor 700 and a base 701. The capacitor 700 include a first supporting layer 702, a second supporting layer 703, and a third supporting layer 704 disposed sequentially parallel to the base 701; first electrode layers 705 disposed perpendicular to the base 701 and penetrating the first supporting layer 702, the second supporting layers 703, and the third supporting layers 704, in which the filling sub-layers 706 are disposed between the second supporting layer 703 and the first electrode layers 705; a dielectric layer 707 covering the surfaces of the first electrode layers 705, the first supporting layer 702, the second supporting layer 703, and the third supporting layer 704; and a second electrode layer 708 covering the surface of the dielectric layer 707.

In the capacitor in the semiconductor device provided by embodiments of the disclosure, the filling sub-layers are disposed between the second supporting layer and the first electrode layers, and the filling sub-layers are in contact with the first electrode layers, so that the filling sub-layers can form support for the first electrode layers, avoiding a problem of capacitor failure caused by collapse of the first electrode layers due to insufficient support for the capacitor, and thus improving the performance of the capacitor.

Figure 8:
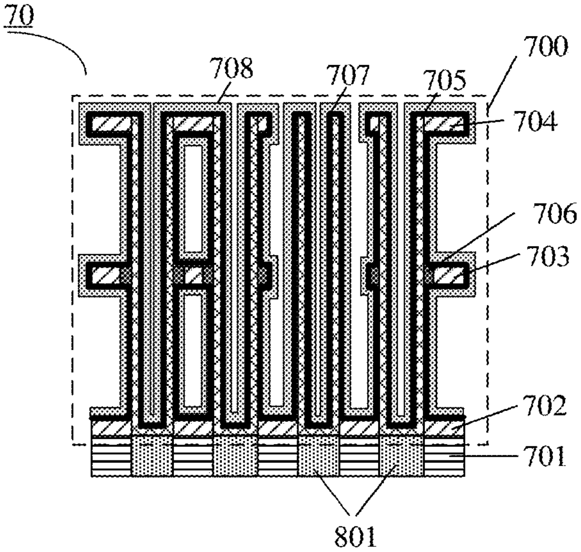
FIG. 8 is a schematic diagram of a partial structure of a semiconductor device provided by an embodiment of the disclosure.

In some embodiments, as shown in FIG. 8, the semiconductor device 70 further includes conductive structures 801 located in the base 701. The conductive structures 801 are connected with the first electrode layers 705. Here, the conductive structures 801 are used to connect the capacitor provided by the embodiments of the disclosure with a lower circuit. In a dynamic random access memory, the conductive structures 801 are used to connect the capacitor with a source or a drain of a lower transistor.

In some embodiments, materials of the first supporting layer 702, the second supporting layer 703, and the third supporting layer 704 include at least one of silicon oxide, silicon nitride, silicon carbonitride, or silicon oxynitride. Materials of the first electrode layers 705 and the second electrode layer 708 include metal nitride and/or metal silicide. A material of the dielectric layer 707 includes at least one of zirconium oxide, hafnium oxide, zirconium titanium oxide, ruthenium oxide, antimony oxide, or aluminum oxide.

In the embodiments provided by the disclosure, it is to be understood that the disclosed device and method may be implemented in a non-target way. The device embodiments described above are only schematic. For example, the division of the unit is only a logical function division, and there may be another division mode in actual implementation, for example, multiple units or components can be combined, or integrated into another system, or some features can be ignored or not executed. In addition, the components shown or discussed are coupled with each other, or directly coupled.

The units described above as separate parts may or may not be physically separated, and the parts shown as units may or may not be physical units, i.e. may be located in one place or may be distributed over multiple network units. According to the actual needs, some or all of the units can be selected to achieve the purpose of the solutions of the embodiments.

The features disclosed in the several method or device embodiments provided by the disclosure can be arbitrarily combined without conflict, in order to obtain a new method embodiment or device embodiment.

The above-mentioned are only some implementations of the disclosure, and the protection scope of the disclosure is not limited thereto. Any changes or substitutions that can be readily conceived by a person skilled in the art within the technical scope disclosed the disclosure shall be covered within the protection scope of the disclosure. Therefore, the protection scope of the disclosure shall be subject to the protection scope of the claims.

INDUSTRIAL PRACTICALITY

In the method for forming a capacitor and the semiconductor device provided by the embodiments of the disclosure, the first through holes are formed and filled after the first supporting layer and the first sacrificial layer are formed, followed by forming the second supporting layer. The second through holes, each with a cross-sectional area larger than that of each of the first through holes, are formed in the second support layer by etching. The second sacrificial layer and third supporting layer are formed sequentially. The third through holes are formed, and the first filling structures are removed. The first electrode layers, the dielectric layer and the second electrode layer are formed sequentially on the surfaces of the first through holes and the third through holes to form the capacitor. In this way, compared with the formation of a whole through hole in the capacitor by one etching, in the embodiments of the disclosure, the through holes in the capacitor are formed by etching in steps, so that the height of the through hole to be etched each time and the etching difficulty are reduced, thereby reducing the probability of etching deflection at a bottom of the capacitor hole in the etching process of the capacitor hole of the capacitor, and thus improving the perpendicularity and quality of the capacitor hole, which is beneficial to enhancing the stability of the capacitor.

The invention claimed is:

1. A semiconductor device, comprising: at least a base and a capacitor;

wherein the capacitor comprises:

a first supporting layer, a second supporting layer and a third supporting layer disposed sequentially parallel to the base;

first electrode layers disposed perpendicular to the base and penetrating the first supporting layer, the second supporting layer and the third supporting layer, wherein filling sub-layers are disposed between the second supporting layer and the first electrode layers;

a dielectric layer covering surfaces of the first electrode layers, the first supporting layer, the second supporting layer and the third supporting layer; and a second electrode layer covering a surface of the dielectric layer;

wherein the first supporting layer and the first electrode layers are in direct contact, the third supporting layer and the first electrode layers are in direct contact, the second supporting layer and the first electrode layers are not in direct contact, the filling sub-layers are blocked between the second supporting layer and the first electrode layers, materials of the first supporting layer, the second support layers and the third supporting layer are different to a material of the filling sub-layers.

2. The semiconductor device of claim 1, further comprising conductive structures located in the base and connected with the first electrode layers.

3. The semiconductor device of claim 1, wherein the material of the first supporting layer, the second supporting layer, or the third supporting layer comprises at least one of silicon boronitride, silicon nitride, silicon carbonitride, or silicon oxynitride.

4. The semiconductor device of claim 1, wherein a material of the first electrode layers or the second electrode layer comprises at least one of metal nitride or metal silicide.

5. The semiconductor device of claim 1, wherein a material of the dielectric layer comprises at least one of zirconium oxide, hafnium oxide, zirconium titanium oxide, ruthenium oxide, antimony oxide, or aluminum oxide.

6. The semiconductor device of claim 1, wherein the material of the filling sub-layers comprises silicon oxide, silicon nitride, silicon carbonitride or silicon oxynitride.

7. The semiconductor device of claim 1, wherein a width of the second supporting layer is smaller than either a width of the third supporting layer or a width of the first supporting layer in a direction parallel to the base.

* * * * *